(12) United States Patent
Leobandung et al.

(10) Patent No.: US 9,496,447 B2
(45) Date of Patent: *Nov. 15, 2016

(54) SIGNAL DISTRIBUTION IN INTEGRATED CIRCUIT USING OPTICAL THROUGH SILICON VIA

(71) Applicant: International Business Machines Corporation, Armonk, NY (US)

(72) Inventors: Effendi Leobandung, Stormville, NY (US); James D. Warnock, Somers, NY (US); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/790,362

(22) Filed: Jul. 2, 2015

(65) Prior Publication Data

US 2016/0118529 A1    Apr. 28, 2016

Related U.S. Application Data

(63) Continuation of application No. 14/524,569, filed on Oct. 27, 2014.

(51) Int. Cl.
*H01L 21/00* (2006.01)
*H01L 31/167* (2006.01)
(Continued)

(52) U.S. Cl.
CPC ....... *H01L 31/167* (2013.01); *H01L 31/02327* (2013.01); *H01L 31/105* (2013.01); *H01L 31/107* (2013.01); *H01L 31/1105* (2013.01); *H01L 31/18* (2013.01); *H01S 5/02252* (2013.01)

(58) Field of Classification Search
CPC ............... H01L 25/167; H01L 2924/12043; H01L 31/1105; H01L 31/0232; H01L 21/768; G02B 6/43
See application file for complete search history.

(56) References Cited

U.S. PATENT DOCUMENTS 6,810,160 B2   10/2004   Sugama et al.
6,845,184 B1   1/2005   Yoshimura et al.
(Continued)

FOREIGN PATENT DOCUMENTS

KR   101233311 B1   2/2013
WO   2012096651 A1   7/2012

OTHER PUBLICATIONS

A. Noriki et al., "Through Silicon Photonic Via (TSPV) with Si Core for Low Loss and High-Speed Data Transmission in Opto-Electronic 3-D LSI," IEEE International Conference on 3D Systems Integration (3DIC), Nov. 2010, pp. 1-4.
(Continued)

*Primary Examiner* — Mohsen Ahmadi
*Assistant Examiner* — Ismail Muse
(74) *Attorney, Agent, or Firm* — Louis J. Percello; Ryan, Mason & Lewis, LLP

(57) ABSTRACT

An optical through silicon via is formed in a silicon substrate of an integrated circuit. A photo detector is formed within the integrated circuit and is optically coupled to a first side of the optical through silicon via. A light generating source optically coupled to a second side of the optical through silicon via is provided. The photo detector is configured to receive a light, generated by the light generating source, propagating through the optical through silicon via. The light, generated by the light generating source, is controlled by a signal generated by a signal generating source.

11 Claims, 5 Drawing Sheets

(51) Int. Cl.
*H01L 31/0232* (2014.01)
*H01L 31/105* (2006.01)
*H01L 31/107* (2006.01)
*H01L 31/11* (2006.01)
*H01L 31/18* (2006.01)
*H01S 5/022* (2006.01)

(56) References Cited

U.S. PATENT DOCUMENTS

| | | | |
|---|---|---|---|
| 7,016,569 B2 | 3/2006 | Mule et al. | |
| 7,058,247 B2 | 6/2006 | Crow et al. | |
| 7,466,880 B2 | 12/2008 | Windover | |
| 2004/0071387 A1 | 4/2004 | Mule et al. | |
| 2004/0100781 A1 | 5/2004 | Bozso et al. | |
| 2008/0181557 A1* | 7/2008 | Wang | G02B 6/12002 385/14 |
| 2009/0074405 A1* | 3/2009 | Inman | H04L 1/205 398/22 |
| 2009/0091652 A1* | 4/2009 | Wernersson | H04N 5/2354 348/371 |
| 2010/0290739 A1* | 11/2010 | Kang | G02B 6/4212 385/52 |
| 2010/0322551 A1* | 12/2010 | Budd | G02B 6/4206 385/14 |
| 2012/0001166 A1* | 1/2012 | Doany | G02B 6/4246 257/43 |
| 2012/0326290 A1 | 12/2012 | Andry et al. | |
| 2014/0054736 A1* | 2/2014 | Meade | H01L 31/1812 257/432 |

OTHER PUBLICATIONS

Wikipedia, "Amorphous Silicon," http://en.wikipedia.org/wiki/Amorphous_silicon, Aug. 2014, 5 pages.

Roy G Gordon, "Atomic Layer Deposition (ALD) of Oxides, Nitrides, Carbides and Metals," Electrochem Symposium, 203rd Meeting, May 1, 2003, 1 page, France.

M.S. Parekh et al., "Electrical, Optical and Fluidic Through-Silicon Vias for Silicon Interposer Applications," IEEE 61st Electronic Components and Technology Conference (ECTC), May-Jun. 2011, pp. 1992-1998.

List of IBM Patents or Patent Applications Treated as Related.

* cited by examiner

200

300

SIGNAL DISTRIBUTION IN INTEGRATED CIRCUIT USING OPTICAL THROUGH SILICON VIA

CROSS-REFERENCE TO RELATED APPLICATION

This application is a Continuation of U.S. patent application Ser. No. 14/524,569, filed on Oct. 27, 2014, the disclosure of which is incorporated herein by reference in its entirety.

FIELD

The field is generally related to signal distribution in integrated circuits.

BACKGROUND

Signal distribution in an integrated circuit can be a challenging issue for integrated circuit designers. In the case when the signal to be distributed is a clock signal, conventional signal distribution typically utilizes a clock tree methodology to ensure that clock edges arrive at various locations throughout an integrated circuit such that set up and hold times are not violated. Clock trees typically utilize many stages of buffers and delay elements to ensure proper timing within the integrated circuit. Such buffers and delay elements not only delay the clock signals, but they also utilize a significant amount of power. The clock distribution circuitry may typically take as much as twenty percent of the overall power used by the integrated circuit.

SUMMARY

Embodiments provide for distribution of optical signals in integrated circuits using optical through silicon vias. In one embodiment, a method comprises the following steps. An optical through silicon via is formed in a silicon substrate of an integrated circuit. A photo detector is formed within the integrated circuit and is optically coupled to a first side of the optical through silicon via. A light generating source optically coupled to a second side of the optical through silicon via is provided. The photo detector is configured to receive a light, generated by the light generating source, propagating through the optical through silicon via. The light, generated by the light generating source, is controlled by a signal generated by a signal generating source.

DETAILED DESCRIPTION

It is to be appreciated that the invention is not limited to the specific methods illustratively shown and described herein. Rather, embodiments of the invention are directed more broadly to techniques for signal distribution using an optical through silicon via (TSV). Moreover, it will become apparent to those skilled in the art given the teachings herein that numerous modifications can be made to the embodiments shown that are within the scope of the present invention. That is, no limitations with respect to the specific embodiments described herein are intended or should be inferred.

Illustrative embodiments of the invention enable signals to be distributed throughout an integrated circuit faster and with less power dissipation than traditional signal distribution methods such as, but not limited to, clock tree methodologies. More particularly, signal distribution according to illustrative embodiments provides for forming one or more optical through silicon vias (TSVs) in an integrated circuit such that optical signals can be distributed there through. FIGS. 1-6 illustrate one or more embodiments for forming an optical TSV in a silicon substrate of an integrated circuit.

Figure 1:
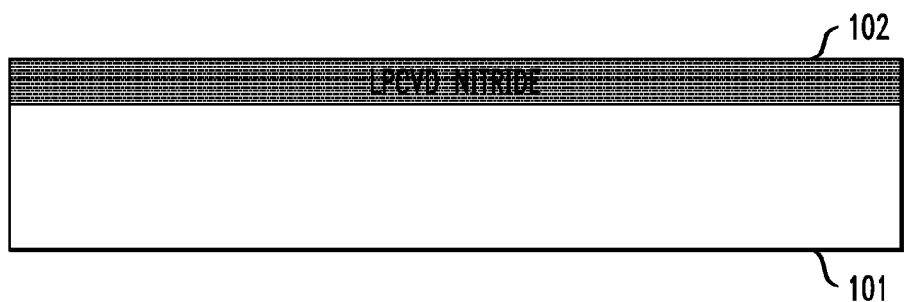
FIG. 1 is a cross sectional view illustrating a silicon substrate with silicon nitride deposited thereon in an embodiment of the invention.
Figure 2:
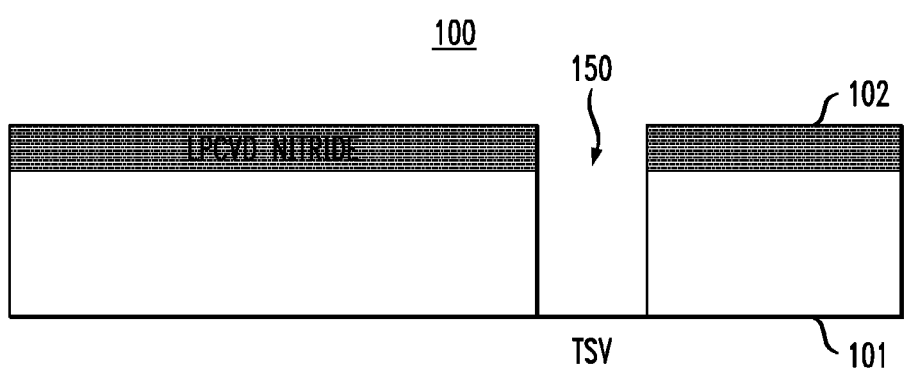
FIG. 2 is a cross sectional view illustrating an etched opening through the silicon substrate of FIG. 1.

FIG. 1 shows integrated circuit wafer 100 comprising a silicon substrate 101. A silicon nitride layer 102 is deposited on the surface of substrate 101 using, for example, a conventional low pressure chemical vapor deposition (LP-CVD) process. In FIG. 2, an opening 150 is etched through the nitride layer 102 and through the underlying silicon substrate 101 to the backside of wafer 100. Opening 150 may be formed, for example, by using a conventional etching process or a conventional laser drilling process.

Figure 3:
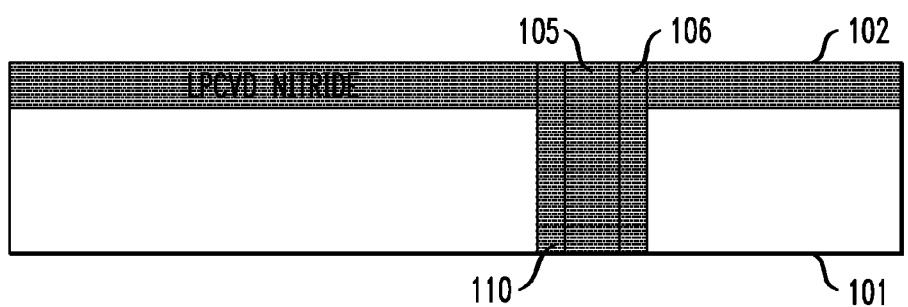
FIG. 3 is a cross sectional view illustrating filling the etched opening formed in FIG. 2 to form an optical through silicon via.

In FIG. 3, optical TSV 110 is formed by first depositing cladding layer 106 on the walls of opening 150 using, for example, a conventional low temperature oxide (LTO) process or a conventional atomic layer deposition (ALD) oxide process. A conventional ALD nitride process is then used to deposit a nitride layer 105 in the center of optical TSV 110. Nitride layer 105 forms the optical transmission media operative to transmit light from the back side of wafer 100 through silicon substrate 101 for local distribution to circuitry formed on the top side of the silicon substrate (which will be described below in the context of FIGS. 7 and 8). In one illustrative embodiment, nitride layer 105 is operative to transmit light having a wavelength greater than about 1 micrometer. However, layer 105 may be formed to transmit light having other wavelengths, depending on the circuitry implemented on the top side of the substrate. In general, the optical TSV is filled with a material that is transparent to a given wavelength of the light source, but wherein the given wavelength of the light source is absorbed in the silicon substrate.

Figure 4:
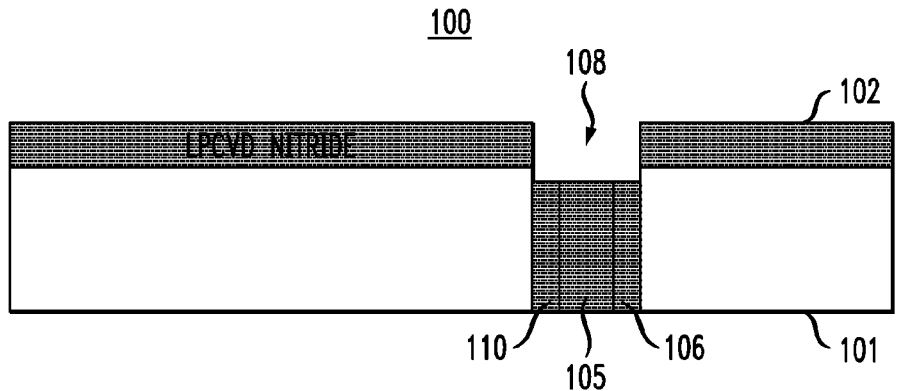
FIG. 4 is a cross sectional view illustrating etching of the optical through silicon via of FIG. 3.

TSV 110 is further processed as shown in FIG. 4, wherein the cladding layer 106 and nitride layer 105 undergo an etching process in order to recess their top surface to below the top surface of the silicon substrate 101. The etching process may be, for example, a conventional wet etching process such as a hydrofluoric acid (HF) etching process. This etching process etches the cladding layer oxide 106 and the ALD nitride layer 105 much faster than it etches the LPCVD nitride layer 102. The LPCVD nitride layer 102 provides a mask to prevent etching silicon substrate 101 in areas other than TSV 110. The etching is performed such that the cladding layer oxide 106 and the ALD nitride layer 105 are recessed to the same or substantially similar depth. One ordinarily skilled in the art will appreciate other chemical mechanical planarization (CMP) processes that can be employed.

Figure 5:
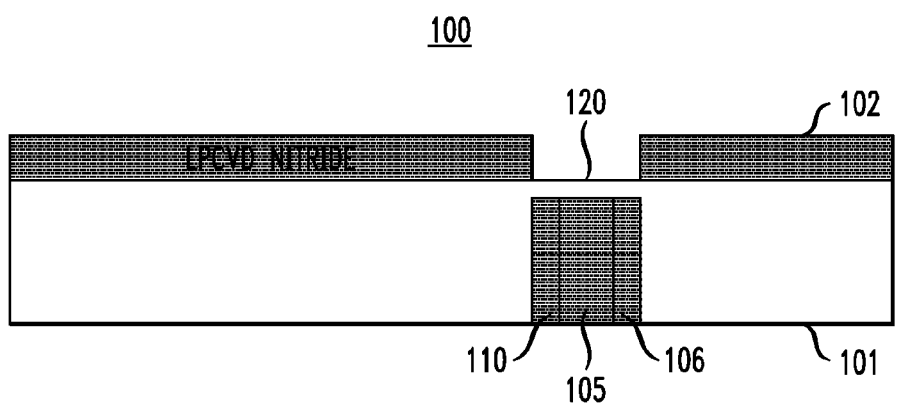
FIG. 5 is a cross sectional view illustrating deposition of silicon epilayer on the optical through silicon via of FIG. 4.

Following the etching process, a silicon epilayer 120 is grown over the top surface of cladding layer oxide 106 and ALD nitride layer 105 which fills in the recessed area between the top surface of TSV 110 and the top surface of silicon substrate 101 as shown in FIG. 5. A conventional epitaxy process can be used to grow the silicon epilayer 120. An overgrown silicon layer followed by planarization using CMP and subsequent recess can also be employed.

Figure 6:
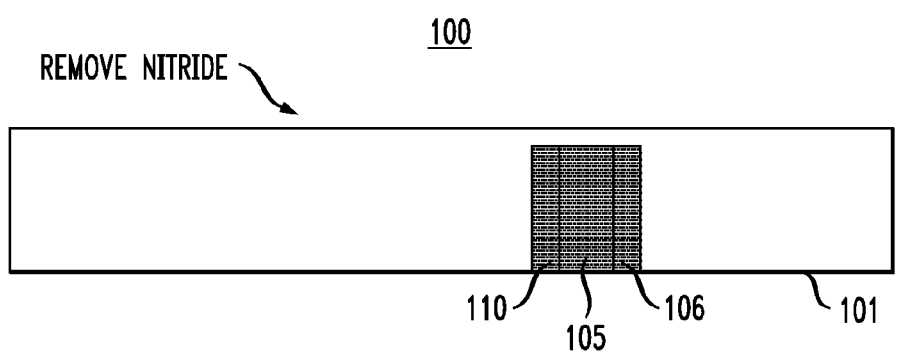
FIG. 6 is a cross sectional view illustrating removal of the nitride layer from FIG. 5.

In FIG. 6, the LPCVD nitride layer 102 is removed, exposing the top surface of silicon substrate 101, in preparation for forming devices including, for example, transistors and electrical interconnects on the silicon substrate.

Figure 7:
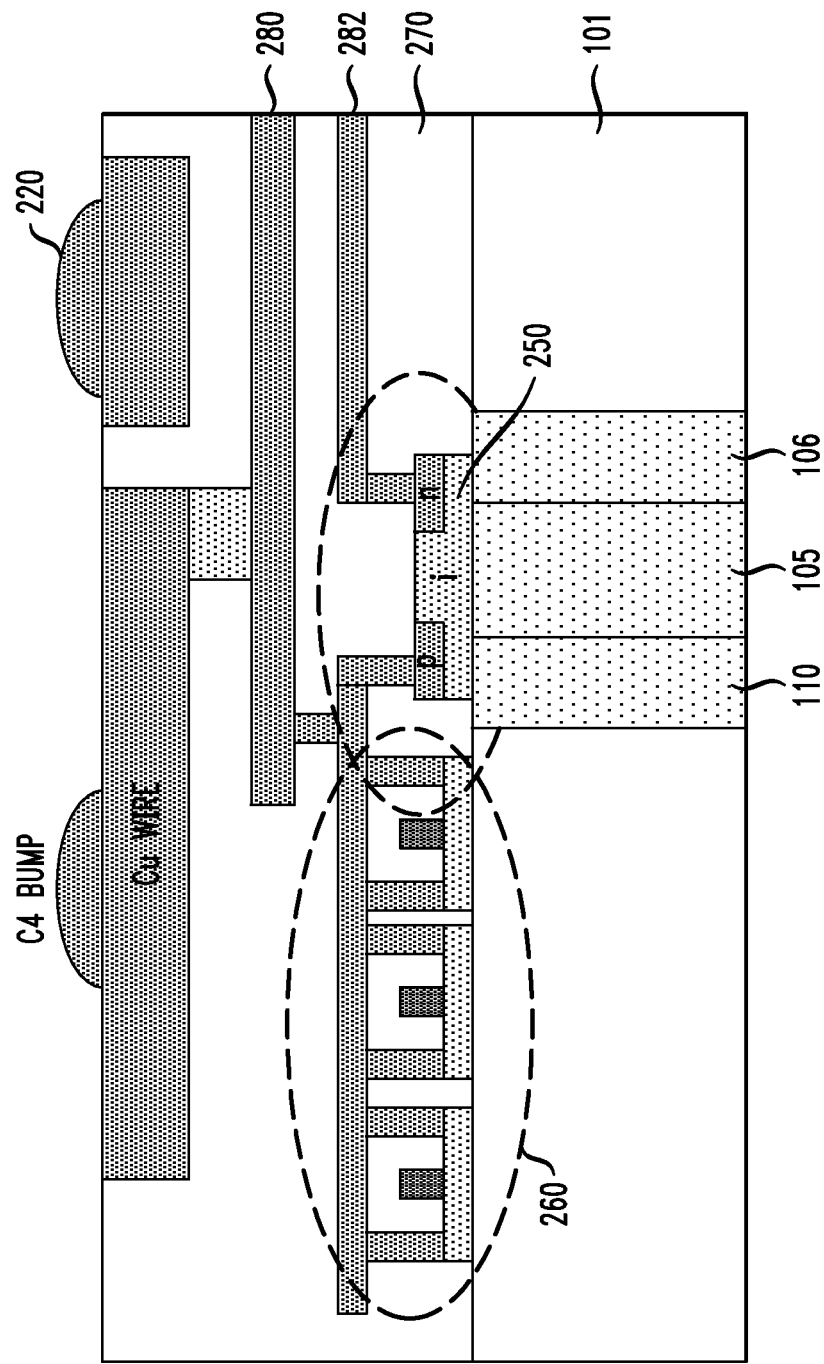
FIG. 7 is a cross sectional view illustrating a photo detector coupled to an optical through silicon via in an embodiment of the invention.

An illustrative example of the circuitry formed on (and/or in) the silicon substrate 101 (following the semiconductor processing described above in the context of FIG. 6) is shown as part of an integrated circuit 200 in FIG. 7. For example, a photo detector 250 such as, for example, a pin diode, an avalanche diode, a metal oxide semiconductor field effect transistor (MOSFET), a bipolar junction transistor (BJT), etc., is formed on (and/or in) the top side of the silicon substrate 101. The photo detector 250 is coupled to the optical TSV 110 formed in the silicon substrate 101 and is operative to receive a signal transmitted by light passing through nitride layer 105. It is to be appreciated that, in one embodiment, the top surface of substrate 101 in FIG. 6 becomes the top surface of electrical circuitry 260 and photo detector 250 as shown in FIG. 7. That is, as further illustrated in FIG. 7, some portion of the top surface of substrate 101, where no circuitry 260 or photo detector 250 is located, has been removed for isolation. A main consideration is that the photo detector 250 is formed on top of the optical TSV 110 so that the optical signal passing through the TSV is received by the photo detector 250. The process of forming elements 250 and 260 is well known to those ordinarily skilled in the art. A main difference depicted herein is instead of using a standard silicon wafer upon which to form other elements as would happen in a conventional approach, illustrative embodiments form elements 250 and 260 using a silicon wafer with one or more optical TSVs formed therein.

A light source, controlled by the signal, may be coupled to the optical TSV 110 at the backside of silicon substrate 101, as will be described below with reference to FIG. 8. In the illustrative embodiment of FIG. 7, the photo detector 250 is shown coupled to electrical interconnects 280 and 282 formed in dielectric layer 270 of the integrated circuit 200. Photo detector 250 converts its received light signals to electrical signals which are then coupled to electrical circuitry, for example, logic gates 260. The electrical signals converted by the photo detector 250 from the received light may also be coupled to input/output (I/O) connections, for example, cooper wire (Cu wire) and/or controlled collapse chip connection (C4) bumps 220, which may be used to couple the electrical signals to other external devices such as circuit boards or other integrated circuits. It is to be appreciated that the coupling of the photo detector 250 to the logic gates 260 and to the various I/O connections (Cu wire, C4 bumps) shown in FIG. 7 is for illustrative purposes and, as such, various alternative interconnections can be utilized. That is, alternative embodiments are not necessarily limited to the specific interconnections illustratively depicted in FIG. 7.

Figure 8:
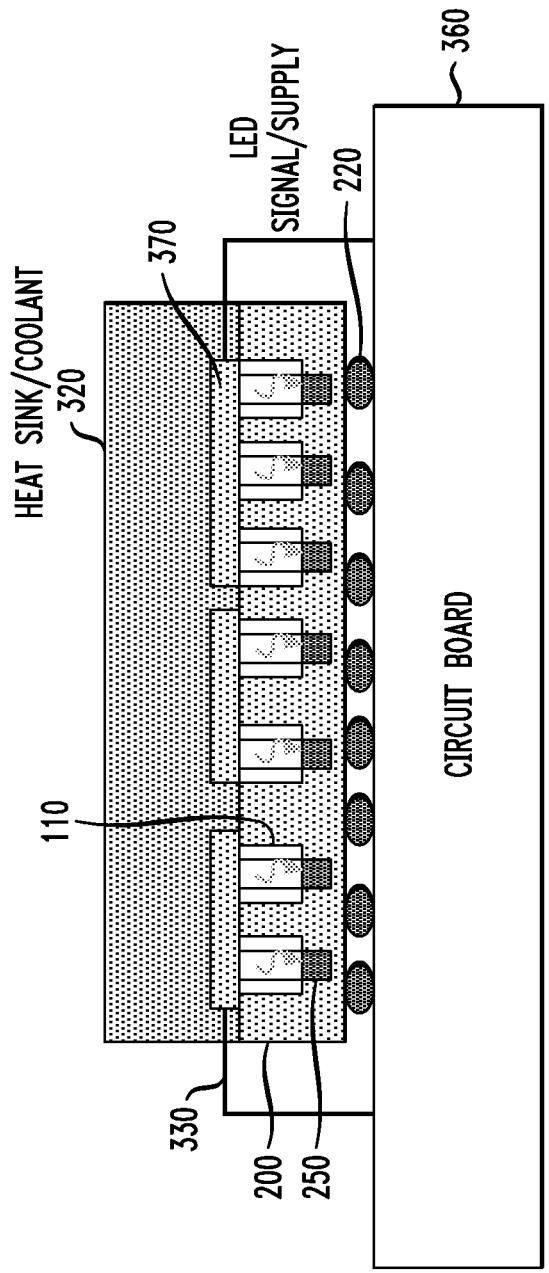
FIG. 8 is a cross sectional view illustrating an optical assembly in an embodiment of the invention.

FIG. 8 is an illustrative embodiment of an assembly 300 comprising integrated circuit 200 (as described above in the context of FIG. 7), circuit board 360, light sources 370, and heat sink/coolant 320. Assembly 300 also may comprise electrical interconnects 330, which couple a signal source on circuit board 360 to light sources 370, and solder balls (C4 bumps) 220 which connect electrical signals on circuit board 360 to electrical signals on integrated circuit 200. Signals generated on circuit board 360 are coupled to light sources 370 bonded to the back side of integrated circuit 200. In other embodiments, the signal sources may be generated on integrated circuit 200 or on other external circuits electrically coupled to integrated circuit 200.

Light sources 370 are controlled by signal sources on circuit board 360, wherein the signal sources preferably may be clock signals to be coupled to various logic gates within integrated circuit 200 via the optical TSVs 110 (note that multiple optical TSVs 110 formed as described herein and coupled to multiple photo detectors 250 are shown in FIG. 8). Light sources 370 may form an array of light sources bonded to the back side of integrated circuit 200, wherein each light source is coupled to an optical TSV in integrated circuit 200. Each light source may comprise, for example, a liquid emitting diode (LED) or laser device. An array of light sources 370, bonded to the back side of integrated circuit 200, may comprise, for example, transparent amorphous silicon (a-Si). Light from light sources 370 is optically transmitted through optical TSVs 110 and received by photo detectors 250. Photo detectors 250 convert the received light into electrical signals, responsive to the signal sources on circuit board 360, and couple the electrical signals to circuitry on integrated circuit 200. It is to be understood that alternative embodiments are not necessarily limited to the specific interconnections illustratively depicted in FIG. 8.

Figure 9:
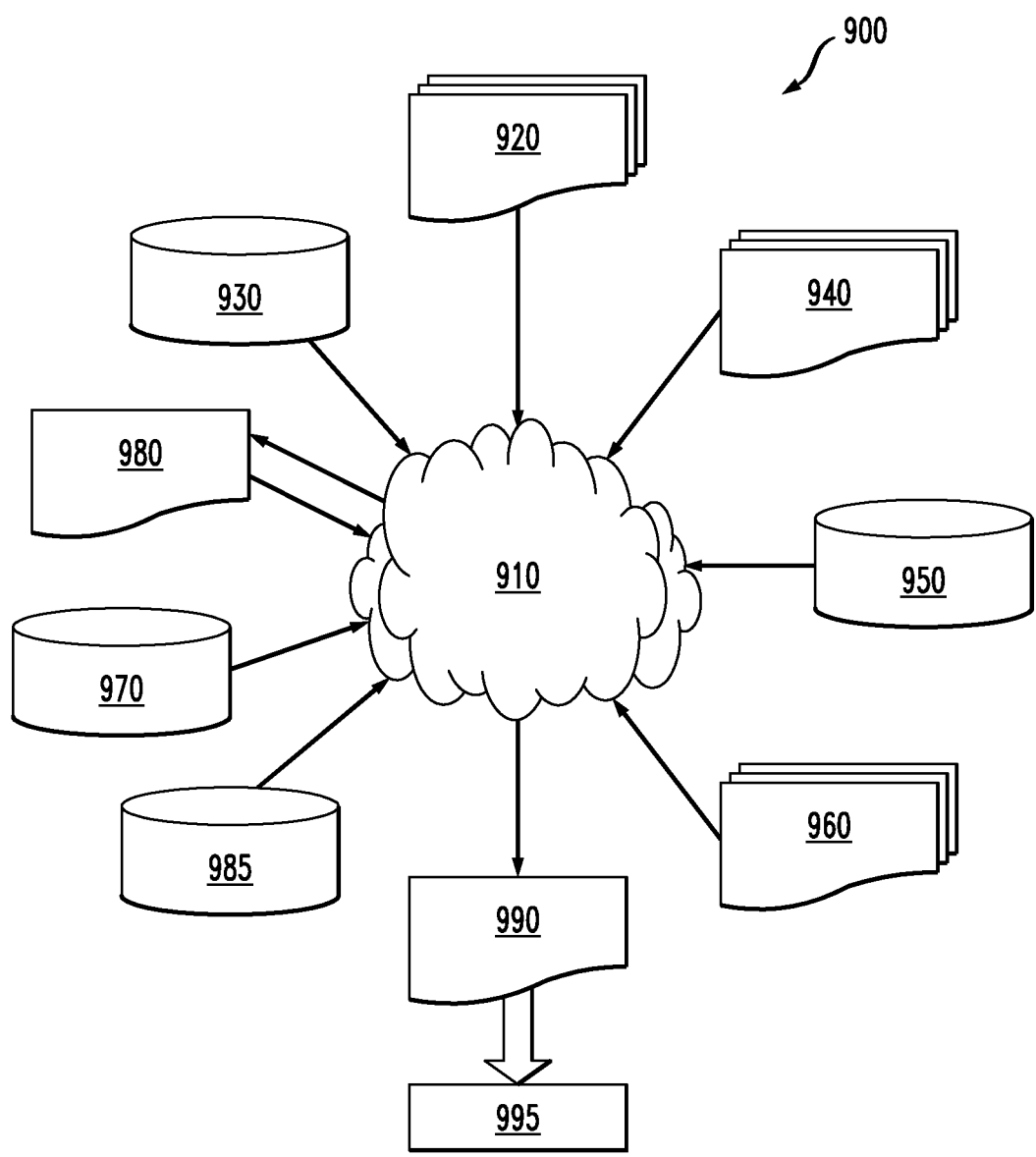
FIG. 9 is a flow diagram of a design process used in semiconductor design, manufacture, and/or test in an embodiment of the invention.

FIG. 9 shows a block diagram of an exemplary design flow 900 used for example, in semiconductor IC (integrated circuit) logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow

900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that, when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nanometer (nm), 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

Furthermore, it is to be appreciated that one or more illustrative embodiments described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard; or (b) an end product. The end product can be any product that includes integrated circuit chips, ranging from toys and other low-end applications to advanced computer products having a display, a keyboard or other input device, and a central processor.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
    forming an optical through silicon via in a silicon substrate of an integrated circuit, wherein the optical through silicon via comprises a nitride layer as an optical transmission medium, and wherein the optical through silicon via is formed by etching the nitride layer to recess a top surface of the nitride layer to below a top surface of the silicon substrate, and forming a silicon epilayer over a top surface of a remainder of the nitride layer;
    forming a photo detector within the integrated circuit optically coupled to a first side of the optical through silicon via;
    forming a set of electrical elements coupled to the photo detectors; and
    providing a light generating source optically coupled to a second side of the optical through silicon via;
    wherein the photo detector is configured to receive a light, generated by the light generating source, propagating through the optical through silicon via, and wherein the light, generated by the light generating source, is an optical signal controlled by a signal generated by the signal generating source;
    wherein the photo detector is further configured to convert the optical signal to an electrical signal, and wherein the electrical signal is distributed to the set of electrical elements.

2. The method of claim 1, wherein the optical signal is a clock signal.

3. The method of claim 1, wherein the light generating source is one of an LED and a laser.

4. The method of claim 1, wherein the light generating source is bonded to a backside of the silicon substrate proximate the second side of the optical through silicon via.

5. The method of claim 1, wherein the light generating source is formed within the integrated circuit.

6. The method of claim 1, wherein the light generating source is formed from a plurality of light sources.

7. The method of claim 1, wherein the photo detector is one of a pin diode, an avalanche diode, a MOSFET and a bipolar junction transistor.

8. The method of claim 1, wherein the nitride layer is transparent to a given wavelength of the light generating source, and wherein the given wavelength of the light generating source is absorbed in the silicon substrate.

9. The method of claim 8, wherein the given wavelength of the light generating source is greater than about 1 micrometer.

10. The method of claim 1, wherein the set of electrical elements comprises a plurality of logic devices.

11. The method of claim 1, wherein the set of electrical elements comprises one or more external input/output connections.

* * * * *